US010462936B2

(12) United States Patent
Nishimoto

(10) Patent No.: US 10,462,936 B2
(45) Date of Patent: Oct. 29, 2019

(54) ELECTRONIC CONTROL UNIT

(71) Applicant: DENSO CORPORATION, Kariya, Aichi-pref. (JP)

(72) Inventor: Ryo Nishimoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 39 days.

(21) Appl. No.: 15/090,268

(22) Filed: Apr. 4, 2016

(65) Prior Publication Data

US 2016/0295745 A1    Oct. 6, 2016

(30) Foreign Application Priority Data

Apr. 6, 2015  (JP) .................................. 2015-777733

(51) Int. Cl.
*H05K 7/20* (2006.01)
(52) U.S. Cl.
CPC ..... *H05K 7/20854* (2013.01); *H05K 7/20845* (2013.01); *H05K 7/209* (2013.01)
(58) Field of Classification Search
CPC .. H05K 7/20518; H05K 1/141; H05K 9/0007; H05K 2201/09081; H05K 7/20409; H05K 13/00; H05K 1/0215; H05K 2201/10386; H05K 2201/10446; H05K 5/0217; H05K 7/20418; H05K 7/20436; H05K 9/0047; H05K 9/0079; H05K 9/0081; H01L 2224/48227; H01L 2224/73265; H01L 2224/48091; H01L 2924/0002; H01L 2924/00012; H01L 2224/32225; H01L 2924/181; H01L 2224/48472
See application file for complete search history.

(56) References Cited

U.S. PATENT DOCUMENTS

| | | | | |
|---|---|---|---|---|
| 6,275,385 B1 * | 8/2001 | Sahara | .................. | H05K 7/1414 361/679.54 |
| 6,501,662 B2 * | 12/2002 | Ikeda | .................... | H02M 7/003 174/252 |
| 6,724,627 B2 * | 4/2004 | Onizuka | ............. | B60R 16/0238 165/185 |
| 6,924,985 B2 * | 8/2005 | Kawakita | ........... | H05K 7/20854 257/711 |
| 7,369,413 B2 * | 5/2008 | Caines | ................... | H05K 5/061 165/80.2 |

(Continued)

FOREIGN PATENT DOCUMENTS

| | | |
|---|---|---|
| JP | 2009-088339 | 4/2009 |
| JP | 2010-238690 A | 10/2010 |
| JP | 2012-069646 A | 4/2012 |

*Primary Examiner* — Adam B Dravininkas
(74) *Attorney, Agent, or Firm* — Knobbe, Martens, Olson & Bear, LLP

(57) ABSTRACT

An electronic control unit includes a plurality of heating elements, a substrate, a heat sink, and a housing. The substrate includes a heating region on which the plurality of heating elements are collectively mounted. The heat sink is provided to be opposed to one surface of the substrate, and includes a radiating part, which is disposed in correspondence to the heating region of the substrate and receives heat generated by the plurality of heating elements. The housing is provided to cover the other surface of the substrate. The heat sink includes a fixation part, which is disposed separately from the radiating part and to which an outer edge part of the housing is fixed.

7 Claims, 6 Drawing Sheets

(56) References Cited

U.S. PATENT DOCUMENTS

| | | | | |
|---|---|---|---|---|
| 8,243,454 | B2* | 8/2012 | Oota | H01L 23/42 |
| | | | | 165/80.3 |
| 8,356,762 | B2* | 1/2013 | Tomikawa | B60R 16/0239 |
| | | | | 165/185 |
| 8,670,240 | B2* | 3/2014 | Hashimoto | H05K 5/0052 |
| | | | | 361/704 |
| 9,293,870 | B1* | 3/2016 | Koczwara | H01R 12/724 |
| 2003/0117776 | A1* | 6/2003 | Katsuro | H05K 7/20854 |
| | | | | 361/705 |
| 2004/0095730 | A1* | 5/2004 | Youm | H01L 23/4006 |
| | | | | 361/718 |
| 2010/0254093 | A1* | 10/2010 | Oota | B60R 16/0239 |
| | | | | 361/720 |
| 2012/0320531 | A1* | 12/2012 | Hashimoto | H05K 7/20854 |
| | | | | 361/720 |
| 2013/0072040 | A1 | 3/2013 | Ohhashi et al. | |
| 2015/0187732 | A1* | 7/2015 | Yoshimi | H01L 25/0655 |
| | | | | 257/713 |
| 2015/0189734 | A1* | 7/2015 | Nishimoto | H05K 7/1432 |
| | | | | 701/41 |

* cited by examiner

ELECTRONIC CONTROL UNIT

CROSS REFERENCE TO RELATED APPLICATION

This application is based on Japanese Patent Application No. 2015-77733 filed on Apr. 6, 2015, the disclosure of which is incorporated herein by reference.

TECHNICAL FIELD

The present disclosure relates to an electronic control unit having a heat sink and a housing.

BACKGROUND

There has been known an electronic control unit, in which a heat sink and a housing are disposed so as to sandwich a substrate from both sides in order to protect the substrate from water, dust, and the like. For example, JP2010-238690A discloses an electronic control unit, in which a resin housing is attached to a heat sink by snap fitting.

For an electronic control unit including a heating element that is appropriately mounted on a substrate and generates heat when power is supplied thereto, as the unit is reduced in size, heat is more readily transferred from the heating element to a housing through a heat sink. When a housing is formed of a material having a low heatproof temperature such as resin as in JP2010-238690A, the housing may be deformed due to heat transferred from the heating element, leading to a reduction in attachment strength of the housing.

SUMMARY

The present disclosure addresses at least one of the above issues. Thus, it is an objective of the present disclosure to provide an electronic control unit capable of suppressing a reduction in attachment strength of a housing to a heat sink.

To achieve the objective of the present disclosure, there is provided an electronic control unit including a plurality of heating elements, a substrate, a heat sink, and a housing. The substrate includes a heating region on which the plurality of heating elements are collectively mounted. The heat sink is provided to be opposed to one surface of the substrate, and includes a radiating part, which is disposed in correspondence to the heating region of the substrate and receives heat generated by the plurality of heating elements. The housing is provided to cover the other surface of the substrate. The heat sink includes a fixation part, which is disposed separately from the radiating part and to which an outer edge part of the housing is fixed.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

An electronic control unit according to an embodiment is now described with reference to the accompanying drawings. An electronic control unit of an embodiment is applied to, for example, an electromotive power steering system of a vehicle, and can control operation of a motor that generates assist torque assisting the steering by a driver.

Figure 1:
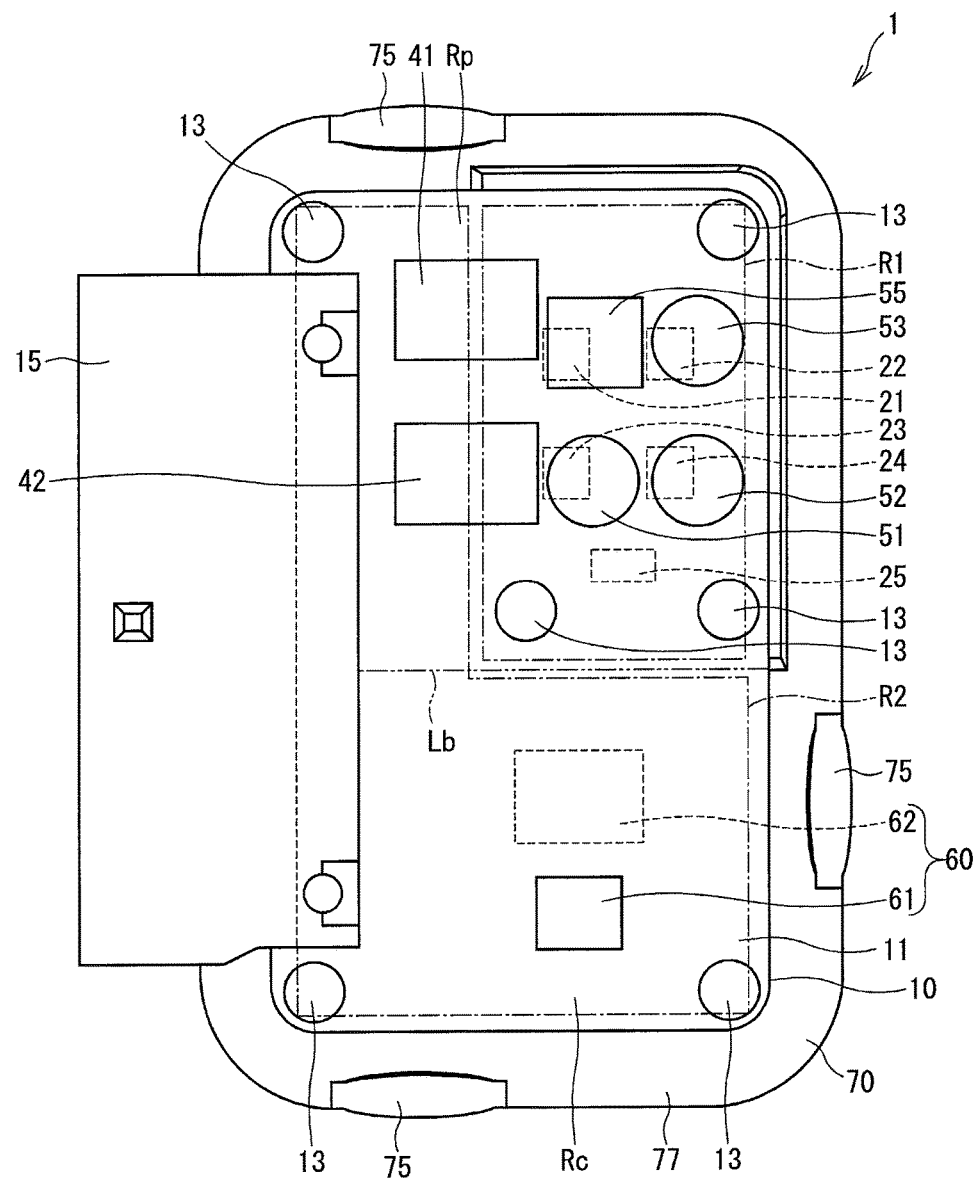
FIG. 1 is a plan view of an electronic control unit according to an embodiment while a housing is omitted.
Figure 2:
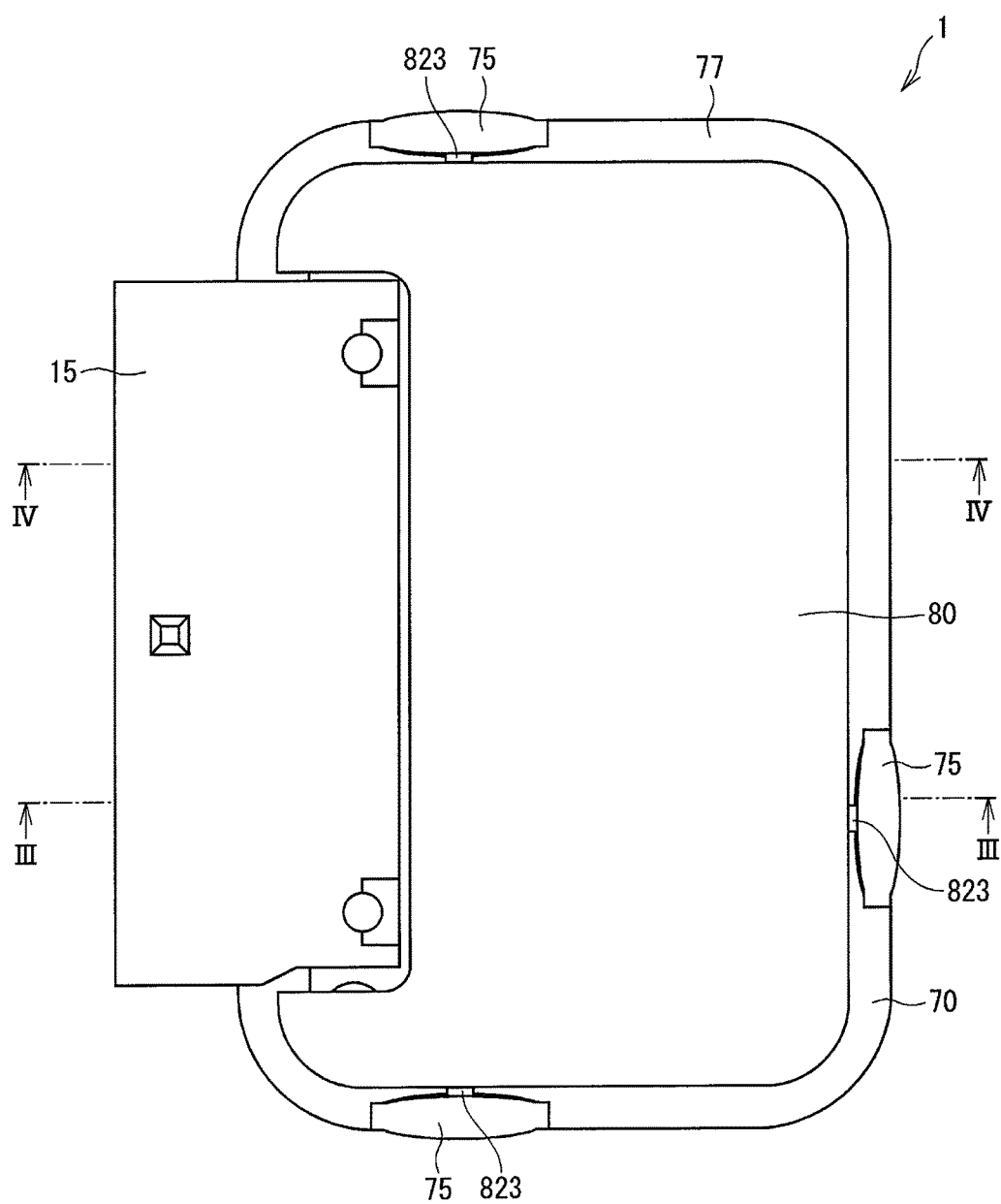
FIG. 2 is a plan view of the electronic control unit of the embodiment.
Figure 3:
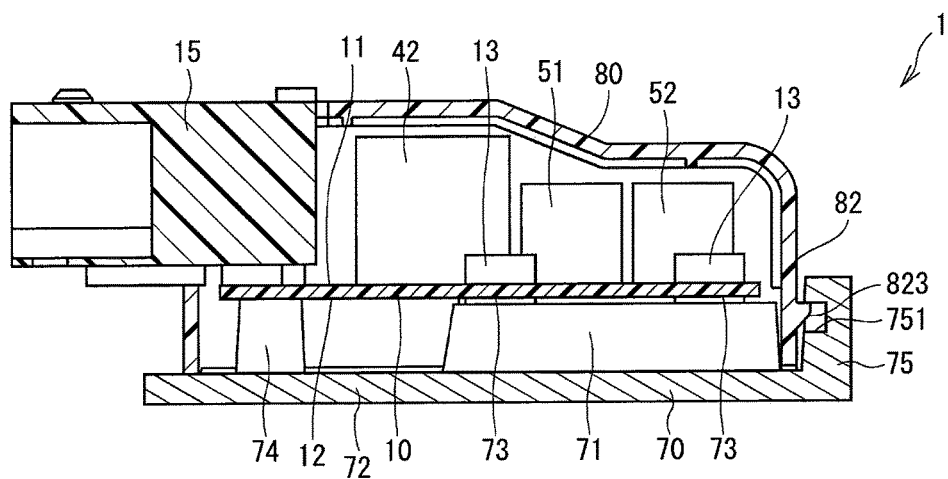
FIG. 3 is a sectional arrow view along a line in FIG. 2.
Figure 4:
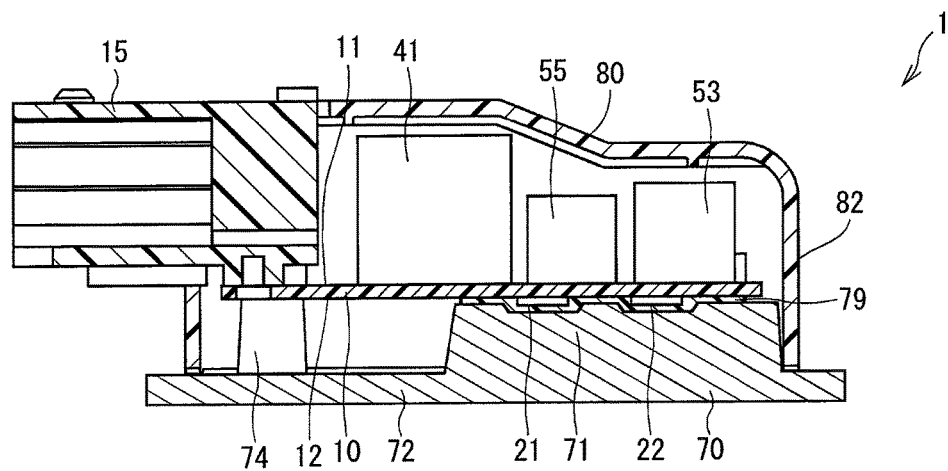
FIG. 4 is a sectional arrow view along a line IV-IV in FIG. 2.
Figure 5:
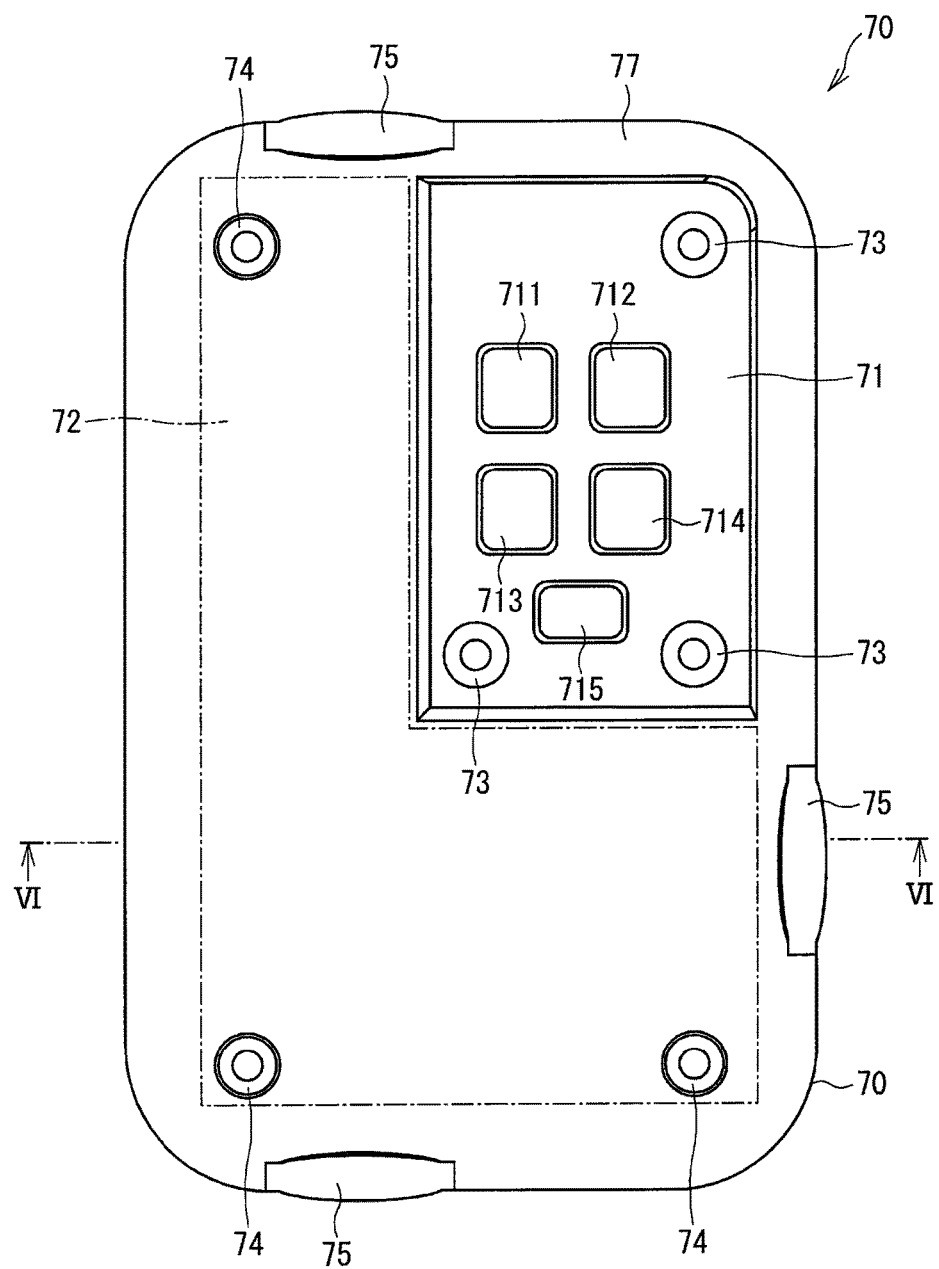
FIG. 5 is a plan view of a heat sink according to the embodiment.
Figure 6:
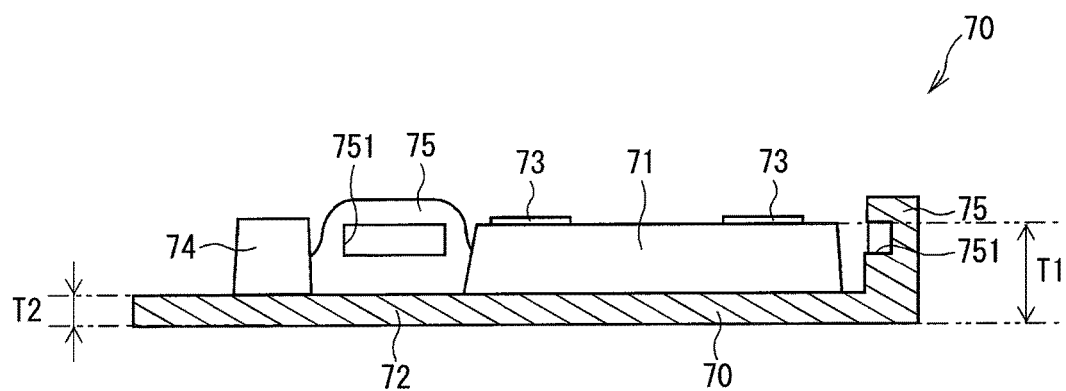
FIG. 6 is a sectional arrow view along a line VI-VI in FIG. 5.

As illustrated in FIGS. 1 to 4, an electronic control unit 1 includes a substrate 10 on which various electronic components are mounted, a heat sink 70, a housing 80, and the like. FIG. 1 omits the housing 80.

Figure 7:
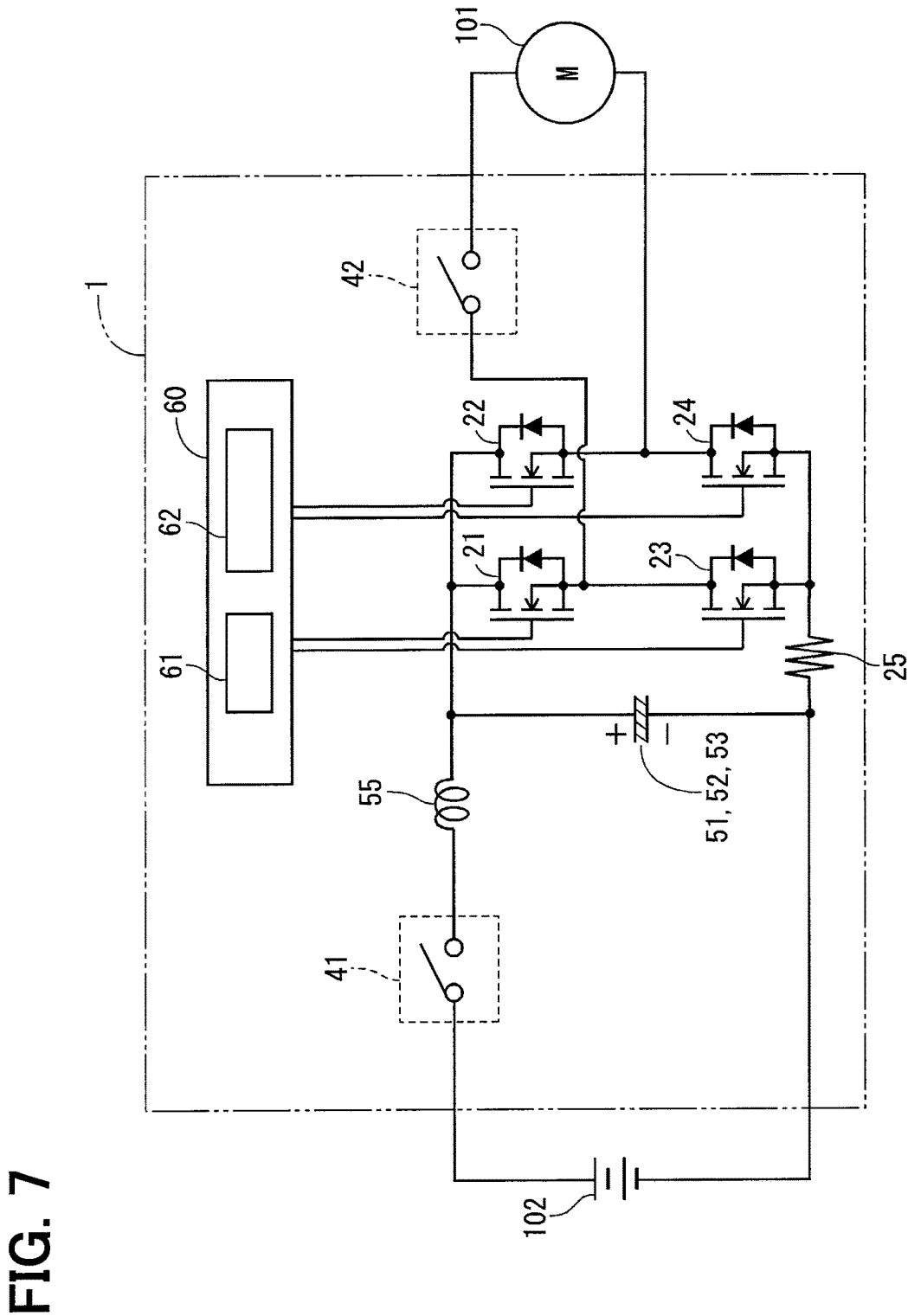
FIG. 7 is a schematic illustration of a circuit configuration of the electronic control unit of the embodiment.

A circuit configuration of the electronic control unit 1 is now described with reference to FIG. 7. The electronic control unit 1 of the present embodiment controls operation of the motor 101 that is, for example, a DC brush motor, and includes the electronic components mounted on the substrate 10, including switching elements 21 to 24, a shunt resistance 25, a power relay 41, a motor relay 42, capacitors 51 to 53, a coil 55, and a control part 60.

The switching elements 21 to 24 configure an H bridge circuit, and each perform ON/OFF operation while being controlled according to a control signal from the control part 60. Although each of the switching elements 21 to 24 is a metal-oxide-semiconductor field-effect transistor (MOSFET) in the present embodiment, the switching element may be another semiconductor element such as an insulated gate bipolar transistor (IGBT).

The node of the switching elements 21 and 22 connected to a high potential side is connected to the positive electrode of the battery 102 via a power relay 41 and the coil 55. The node of the switching elements 23 and 24 connected to a low potential side is connected to the negative electrode of the battery 102 via the shunt resistance 25. A motor relay 42 and the motor 101 are connected between the node of the switching elements 21 and 23 and the node of the switching elements 22 and 24.

The shunt resistance 25 detects a current applied to the motor 101. Each of the capacitors 51 to 53 is, for example, an aluminium electrolytic capacitor, and is connected in parallel with the battery 102. The capacitor stores electrical charges, and thereby assists power supply to the switching elements 21 to 24, and suppresses noise components such as a surge voltage. The coil 55 is, for example, a chalk coil, and is connected between the battery 102 and the power relay 41 so as to reduce noise.

The control part 60 includes a microcomputer 61 and a custom IC 62. The control part 60 controls operation of each of the switching elements 21 to 24 according to a required output torque of the motor 101 or a feedback current, and thereby controls rotation of the motor 101.

A configuration of the electronic control unit 1 is now described with reference to FIGS. 1 to 6. The substrate 10 is a printed circuit board formed into a substantially rectangular shape with an insulating material. The substrate 10 is provided with a connector 15 to be connected to a harness or the like allowing the electronic control unit 1 to externally receive/send power or a control signal.

In the present embodiment, the electronic components configuring the electronic control unit 1 are each mounted on either side of one substrate 10. This makes it possible to decrease the number of components and reduce a unit size compared with the case of an electronic control unit configured of a plurality of substrates. One surface of the substrate 10 is referred to as surface mounting surface 11, and the other surface is referred to as back mounting surface 12.

In the present embodiment, the substrate 10 is partitioned on one plane into a power region Rp in which power electronic components are mounted, and a control region Rc in which control electronic components are mounted. FIG. 1 shows the boundary between the power region Rp and the control region Rc by a chain double-dashed line Lb.

The power electronic components mounted in the power region Rp are the switching elements 21 to 24, the shunt resistance 25, the power relay 41, the motor relay 42, the capacitors 51 to 53, and the coil 55. Some of the electronic components each having a relatively large body size, i.e., electronic components other than the switching elements 21 to 24 and the shunt resistance 25 are mounted on the surface mounting surface 11, while the switching elements 21 to 24 and the shunt resistance 25 are mounted on the back mounting surface 12. The control electronic components mounted in the control region Rc are the microcomputer 61 and the custom IC 62. The microcomputer 61 is mounted on the surface mounting surface 11, while the custom IC 62 is mounted on the back mounting surface 12.

An undepicted land pattern is provided between the power region Rp and the control region Rc, and thus the ground of each power electronic component is isolated from the ground of each control electronic component by the land pattern. Consequently, the control electronic component is less affected by noise caused by a large current applied to the power electronic component.

In the present embodiment, each of the switching elements 21 to 24 and the shunt resistance 25 generates relatively large amount of heat when power is supplied thereto and is thus highly necessary to radiate heat, and thus corresponds to "heating element". Hereinafter, the switching elements 21 to 24 and the shunt resistance 25 are appropriately referred to as heating elements 21 to 25.

The heating elements 21 to 25 are collectively mounted in one region of the substrate 10. Hereinafter, the one region of the substrate 10, in which the heating elements 21 to 25 are mounted, is referred to as heating region R1. The other region of the substrate 10, i.e., a substrate region other than the heating region R1 is referred to as non-heating region R2. In the present embodiment, the non-heating region R2 includes the control region Rc and part of the power region Rp. This can be expressed in different words as follows: The control electronic components are mounted in the non-heating region R2.

The heat sink 70 is generally formed into a substantially plate shape with a material having high heat conductance such as aluminum, and is disposed so as to be opposed to the back mounting surface 12 of the substrate 10. The heat sink 70 has a radiating part 71 corresponding to the heating region R1 of the substrate 10, and a non-heating-region corresponding part 72 corresponding to the non-heating region R2 of the substrate 10.

The radiating part 71 has a shape of projecting toward the substrate 10 unlike the non-heating-region corresponding part 72. As a result, the thickness T1 of the radiating part 71 is larger than the thickness T2 of the non-heating-region corresponding part 72 in a direction perpendicular to the substrate 10 (see FIG. 6). This provides a certain mass of the radiating part 71.

The radiating part 71 has recesses 711 to 715 accommodating the heating elements 21 to 25, and is opposed to the backs of the heating elements 21 to 25. A thermally-conductive insulating component 79 exists between each of the heating elements 21 to 25 and the radiating part 71. In other words, the radiating part 71 is in contact with the heating elements 21 to 25 with the thermally-conductive insulating component 79 in between.

The heat sink 70 has support parts 73 and 74 supporting the substrate 10. The substrate 10 is fixed to the support parts 73 and 74 of the heat sink 70 by fixation components 13 such as small screws. A plurality of support parts 73 are provided in the radiating part 71, while a plurality of support parts 74 are provided in the non-heating-region corresponding part 72.

The heat sink 70 is disposed separately from the radiating part 71, and has fixation parts 75 fixing an outer-edge part 82 of the housing 80. In the present embodiment, a plurality of fixation parts 75 are provided at some interval at positions adjacent to the non-heating-region corresponding part 72 in an outer-edge part 77 of the heat sink 70. Each fixation part 75 has a shape of projecting toward the substrate 10 unlike the non-heating-region corresponding part 72, and has a recess 751 on its side face.

The housing 80 is formed into a substantially box shape with, for example, resin, and covers a surface-mounting-surface 11 side of the substrate 10. The housing 80 and the heat sink 70 are thus disposed so as to sandwich the substrate 10 from both sides, thereby the electronic components mounted on the surface mounting surface 11 and the back mounting surface 12 of the substrate 10 can be protected from external shock, water, dust, and the like.

The outer-edge part 82 of the housing 80 is fixed by the fixation parts 75 of the heat sink 70. In the present embodiment, the outer-edge part 82 is fixed by snap fitting. Specifically, the outer-edge part 82 of the housing 80 has a plurality of engagement parts 823 provided in correspondence to the fixation parts 75 of the heat sink 70. Each engagement part 823 laterally projects from the outer-edge part 82.

When the housing 80 is attached to the heat sink 70, the engagement part 823 is fitted in the recess 751 of the fixation part 75 by resilient force of the housing 80 itself. Consequently, the engagement part 823 is resiliently engaged in the fixation part 75.

Effects of the electronic control unit 1 of the present embodiment will be described. (1) As described above, the electronic control unit 1 of the present embodiment includes the substrate 10 having the heating region R1 in which the heating elements 21 to 25 are collectively mounted, the heat sink 70 provided so as to be opposed to the back mounting surface 12 as one surface of the substrate 10, and the housing 80 provided so as to cover the surface mounting surface 11 as the other surface of the substrate 10. The heat sink 70 includes the radiating part 71 receiving the heat generated by the heating elements 21 to 25 disposed in correspondence to the heating region R1 of the substrate 10, and the fixation parts 75 disposed separately from the radiating part 71 and fixing the outer-edge part 82 of the housing 80.

According to such a configuration, the heat generated by the heating elements 21 to 25 is transferred from the radiating part 71 toward the fixation parts 75 in the heat sink 70. Hence, the heat from the heating elements 21 to 25 is reduced in temperature while being transferred through the radiating part 71, and is thus less likely to be transferred to the fixation parts 75 disposed separately from the radiating part 71. Specifically, it is possible to limit the heat transferred from the heating elements 21 to 25 to the fixation parts 75.

In particular, the electronic control unit 1 of the present embodiment is suitably used as an electronic control unit in which a large current flows in a moment, such as an electronic control unit for an electromotive power steering system. The heat (momentary heat), which is generated by the heating elements 21 to 25 when a large current is applied thereto in a moment, has a large influence on the environment compared with steadily generated heat. In the present embodiment, a smaller quantity of momentary heat is transferred from the heating elements 21 to 25 to the fixation parts 75, which effectively suppresses temperature rise of the fixation parts 75.

According to such a configuration, the housing 80 fixed by the fixation parts 75 is less likely to be affected by the heat generated by the heating elements 21 to 25, and is thus limitedly deformed by the heat. Consequently, the electronic to control unit 1 of the present embodiment can suppress a reduction in attachment strength of the housing 80 to the heat sink 70.

(2) In the present embodiment, the substrate 10 further includes the non-heating region R2 partitioned from the heating region R1 on one plane, and the heat sink 70 further has the non-heating-region corresponding part 72 disposed in correspondence to the non-heating region R2 of the substrate 10. The thickness T1 of the radiating part 71 is larger than the thickness T2 of the non-heating-region corresponding part 72 in a direction perpendicular to the substrate 10.

According to such a configuration, a certain mass of the radiating part 71 can be provided. This makes it possible to improve radiation performance of the heating elements 21 to 25. In addition, this reduces the heat quantity of the momentary heat transferred from the heating elements 21 to 25 to the fixation parts 75, making it possible to further reduce influence of the heat by the heating elements 21 to 25 on the housing 80. The non-heating-region corresponding part 72 contributes less to radiation from the heating elements 21 to 25, and is thus allowed to be reduced in thickness, leading to lightweight of the heat sink 70.

(3) In the present embodiment, each fixation part 75 is disposed at a position adjacent to the non-heating-region corresponding part 72 in the outer-edge part 77 of the heat sink 70. According to such a configuration, the fixation part 75 is securely disposed separately from the radiating part 71, which makes it possible to further reduce influence of the heat by the heating elements 21 to 25 on the housing 80.

(4) In the present embodiment, the housing 80 is formed of a resin material, and the outer-edge part 82 of the housing 80 has the engagement parts 823 in resiliently engagement with the respective fixation parts 75 of the heat sink 70.

According to such a configuration, the housing 80 can be easily fixed to the heat sink 70 by so-called snap fitting. Moreover, creep deformation of the engagement part 823 of the housing 80 is restricted even if the resin material as the formation material of the housing 80 has a low allowable temperature. Hence, the engagement part 823 is securely engaged in the fixation part 75.

(5) In the present embodiment, the heating elements 21 to 25 are mounted on the back mounting surface 12 of the substrate 10, while the radiating part 71 receives the heat from the backs of the heating elements 21 to 25 opposed to the radiating part 71. According to such a configuration, radiation performance of the heating elements 21 to 25 can be improved compared with the configuration of the existing technique in which heat is merely radiated from an external terminal of each heating element toward the substrate.

Modifications to the above embodiment will be described below.

(A) Heating Element

In a modification, the heating element may not be the switching element or the shunt resistance, but may be another electronic component mounted on the substrate. In a modification, the heating element may be mounted on the surface mounting surface of the substrate.

(B) Substrate

A layout of each of the heating region and the non-heating region of the substrate of the disclosure is not limited to that in the above embodiment, and may include any layout as long as the heating region is partitioned from the non-heating region on one plane.

(C) Radiating Part

In the above embodiment, the radiating part 71 is in contact with the heating elements 21 to 25 while the thermally-conductive insulating component 79 such as a radiating gel exists therebetween, but the disclosure is not limited thereto. In the disclosure, the configuration of "receiving the heat generated by the heating elements" of the radiating part includes the following embodiments in addition to the above embodiment. For example, in the case of a module in which the backs of the heating elements are covered with an insulating material, the radiating part may be directly in contact with the module with no thermally-conductive insulating component in between. When the heating elements are mounted in the radiating region on a surface-mounting-surface side of the substrate, the radiating part may be in contact with the radiating region of the substrate with the thermally-conductive insulating component in between.

(D) Fixation Part

If the fixation part of the disclosure is disposed separately from the radiating part, the fixation part may have another shape and another layout without being limited to those in the above embodiment. For example, the fixation part may be disposed at a position adjacent to the radiating part in the outer-edge part of the heat sink, or may have one of various shapes in accordance with the fixing method of the housing as described below.

(E) Housing

In the disclosure, the method of fixing the housing to the heat sink is not limited to that in the above embodiment. For example, although the fixation part 75 has the recess 751, and the outer-edge part 82 of the housing 80 has the convex engagement part 823 in the above embodiment, such a concave and convex relationship may be reversed. Moreover, snap fitting is not limitative, and an adhesive or the like may be used in the fixing portion.

(F) Electronic Control Unit

The electronic control unit of the disclosure may be used not only as a unit that drives the steering assist motor of the electromotive power steering system, but also as any of units for other service including the heating elements. The disclosure is not limited to the above-described embodiments, and can be carried out in various modes within the scope without departing from the gist of the disclosure.

To sum up, the electronic control unit 1 of the above embodiment may be described as follows.

An electronic control unit 1 includes a plurality of heating elements 21-25, a substrate 10, a heat sink 70, and a housing 80. The substrate 10 includes a heating region R1 on which the plurality of heating elements 21-25 are collectively mounted. The heat sink 70 is provided to be opposed to one surface 12 of the substrate 10, and includes a radiating part 71, which is disposed in correspondence to the heating region R1 of the substrate 10 and receives heat generated by the plurality of heating elements 21-25. The housing 80 is provided to cover the other surface 11 of the substrate 10. The heat sink 70 includes a fixation part 75, which is disposed separately from the radiating part 71 and to which an outer edge part 82 of the housing 80 is fixed.

"A fixation part 75 is disposed separately from the radiating part 71" does not necessarily mean that the fixation part 75 and the radiating part 71 are individual components. That is, the fixation part 75 and the radiating part 71 may be integrally configured as the heat sink 70. In other words, the fixation part 75 may exist as a section different from the radiating part 71.

According to such a configuration, heat generated by the heating elements 21-25 is transferred from the radiating part 71 toward the fixation part 75 in the heat sink 70. Hence, the heat from the heating elements 21-25 is reduced in temperature while being transferred through the radiating part 71, and is thus less likely to be transferred to the fixation part 75 disposed separately from the radiating part 71. Specifically, it is possible to reduce the quantity of heat transferred from the heating elements 21-25 to the fixation part 75.

In particular, the electronic control unit 1 of the embodiment is suitably used as an electronic control unit in which a large current flows in a moment, such as an electronic control unit for an electromotive power steering system. The heat (momentary heat), which is generated by the heating elements 21-25 when a large current is applied thereto in a moment, has a large thermal influence on the environment compared with steadily generated heat. In the embodiment, a smaller quantity of momentary heat is transferred from the heating elements 21-25 to the fixation part 75, which effectively suppresses temperature rise of the fixation part 75.

According to such a configuration, the housing 80 fixed by the fixation part 75 is less likely to be affected by the heat generated by the heating elements 21-25, and is thus limitedly deformed by the heat. Consequently, according to the embodiment, there is provided an electronic control unit 1 capable of suppressing a reduction in attachment strength of the housing 80 to the heat sink 70.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
   a plurality of heating elements;
   a substrate that includes a heating region on which the plurality of heating elements are collectively mounted;
   a heat sink that is provided to be opposed to one surface of the substrate and includes a radiating part, which is disposed in correspondence to the heating region of the substrate and receives heat generated by the plurality of heating elements;
   a housing that is provided to be opposed to the other surface of the substrate, wherein the heat sink includes a fixation part, which is disposed separately from the radiating part and to which an outer edge part of the housing is fixed; and
   a plurality of electronic components that are mounted on the other surface of the substrate, the one surface and the other surface being opposite sides of the substrate, wherein
   the plurality of heating elements are mounted on the one surface of the substrate and located between the substrate and the heat sink in a direction perpendicular to the substrate;
   the radiating part receives heat from surfaces of the plurality of heating elements opposed to the radiating part;
   the electronic control unit further comprises a thermally-conductive insulating component between the plurality of heating elements and the radiating part; and
   the thermally-conductive insulating component is in direct physical contact with the radiating part and the plurality of heating elements.

2. The electronic control unit according to claim 1, wherein:
   the substrate further includes a non-heating region which is coplanarly divided from the heating region;
   the heat sink further includes a non-heating-region corresponding part which is disposed in correspondence to the non-heating region of the substrate; and
   a thickness of the radiating part is larger than a thickness of the non-heating-region corresponding part in a direction perpendicular to the substrate.

3. The electronic control unit according to claim 2, wherein the fixation part is disposed at a position adjacent to the non-heating-region corresponding part at an outer-edge part of the heat sink.

4. The electronic control unit according to claim 1, wherein:
   the housing is formed from a resin material; and
   the outer edge part of the housing includes an engagement part in resilient engagement with the fixation part of the heat sink.

5. The electronic control unit according to claim 1, wherein at least some of the electronic components are disposed between the plurality of heating elements and the housing in a direction perpendicular to the substrate.

6. The electronic control unit according to claim 1, wherein the plurality of heating elements include semiconductors and the plurality of electronic components include relays and capacitors.

7. The electronic control unit according to claim 1, further comprising a connector mounted on the other surface of the substrate such that the connector and the plurality of electronic components are positioned on a side of the substrate that is opposite the plurality of heating elements and the radiating part.

* * * * *

UNITED STATES PATENT AND TRADEMARK OFFICE
CERTIFICATE OF CORRECTION

PATENT NO.         : 10,462,936 B2
APPLICATION NO.    : 15/090268
DATED              : October 29, 2019
INVENTOR(S)        : Ryo Nishimoto Page 1 of 1

It is certified that error appears in the above-identified patent and that said Letters Patent is hereby corrected as shown below:

On the Title Page

Column 1 (Item 30) Foreign Application Priority Data, Line 2, change "2015-777733" to --2015-077733--.

In the Specification

Column 5, Line 17 (approx.), before "control" delete "to".

Signed and Sealed this
Thirty-first Day of March, 2020

Andrei Iancu
*Director of the United States Patent and Trademark Office*